(12) United States Patent
De Voeght et al.

(10) Patent No.: US 7,141,104 B2
(45) Date of Patent: Nov. 28, 2006

(54) UV-ABSORBING INK COMPOSITION FOR INK-JET PRINTING

(75) Inventors: Frank De Voeght, Heist-op-den-Berg (BE); Geert Deroover, Lier (BE)

(73) Assignee: Agfa-Gevaert, Mortsel (BE)

( * ) Notice: Subject to any disclaimer, the term of this patent is extended or adjusted under 35 U.S.C. 154(b) by 389 days.

(21) Appl. No.: 10/842,293

(22) Filed: May 10, 2004

(65) Prior Publication Data

US 2004/0244643 A1 Dec. 9, 2004

Related U.S. Application Data

(60) Provisional application No. 60/483,723, filed on Jun. 30, 2003.

(30) Foreign Application Priority Data

Jun. 5, 2003 (EP) ................................ 03101632

(51) Int. Cl.
*C09D 11/00* (2006.01)
*C09D 11/02* (2006.01)
*B41J 2/01* (2006.01)

(52) U.S. Cl. ................ 106/31.49; 106/31.77; 347/100

(58) Field of Classification Search ......... 106/31.49, 106/31.77; 427/558, 256; 347/107; 252/589, 252/401
See application file for complete search history.

(56) References Cited

U.S. PATENT DOCUMENTS

| | | | | |
|---|---|---|---|---|
| 3,531,479 | A | 9/1970 | Harris et al. | 260/240.1 |
| 3,739,393 | A | 6/1973 | Lyon et al. | 346/1 |
| 3,805,273 | A | 4/1974 | Brady et al. | 346/75 |
| 3,891,121 | A | 6/1975 | Stoneburner | 222/1 |
| 3,959,265 | A * | 5/1976 | Avar et al. | 544/64 |
| 3,963,737 | A * | 6/1976 | Avar et al. | 548/105 |
| 3,976,658 | A * | 8/1976 | Avar et al. | 548/370.4 |
| 4,146,540 | A * | 3/1979 | Avar et al. | 548/105 |
| 4,256,493 | A | 3/1981 | Yokoyama et al. | 106/22 |
| 4,737,190 | A * | 4/1988 | Shimada et al. | 106/31.48 |
| 5,096,489 | A * | 3/1992 | Laver | 106/31.47 |
| 5,124,723 | A * | 6/1992 | Laver | 347/100 |
| 5,489,503 | A * | 2/1996 | Toan | 430/507 |
| 5,495,803 | A | 3/1996 | Gerber et al. | 101/401.1 |
| 5,610,305 | A * | 3/1997 | Kvitko et al. | 546/6 |
| 5,997,628 | A | 12/1999 | Bindra | 106/496 |
| 6,251,173 | B1 * | 6/2001 | Holloway et al. | 106/31.49 |
| 6,508,872 | B1 * | 1/2003 | Nguyen et al. | 106/31.47 |
| 6,638,997 | B1 * | 10/2003 | Galbo et al. | 524/99 |
| 6,716,277 | B1 * | 4/2004 | Naruse et al. | 106/31.27 |

FOREIGN PATENT DOCUMENTS

| | | |
|---|---|---|
| EP | 0 737 722 | 10/1996 |
| EP | 0 992 846 | 4/2000 |
| EP | 1 349 004 | 10/2003 |
| GB | 1096488 | 12/1967 |
| JP | 58-049764 | 3/1983 |
| JP | 59-053566 | 3/1984 |
| WO | 97/25206 | 7/1997 |

OTHER PUBLICATIONS

European Search Report EP 03 10 1632, Nov. 6, 2003, Shmitz.

* cited by examiner

*Primary Examiner*—Helene Klemanski
(74) *Attorney, Agent, or Firm*—Joseph T. Guy; Nexsen Pruet, LLC

(57) ABSTRACT

Ink compositions for ink-jet printing is disclosed comprising an UV-absorbing compound according to formula (I):

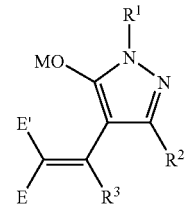

formula (1)
whereby the different symbols are defined in the claims and description.

The invention further encompasses a method for making an UV-sensitive printing element using the thus defined ink compositions.

11 Claims, No Drawings

UV-ABSORBING INK COMPOSITION FOR INK-JET PRINTING

CROSS-REFERENCE TO RELATED PATENT APPLICATIONS

This application claims the benefit of U.S. Provisional Application No. 60/483,723 filed Jun. 30, 2003, which is incorporated by reference. In addition, this application claims the benefit of European Application No. 03101632.2 filed Jun. 5, 2003, which is also incorporated by reference.

TECHNICAL FIELD

The present invention relates to an improved UV-absorbing ink composition for ink-jet printing.

BACKGROUND ART

In ink-jet printing tiny drops of ink fluid are projected directly onto an ink-receiver surface without physical contact between the printing device and the ink-receiver. The printing device stores the printing data electronically and controls a mechanism for ejecting the ink drops image-wise onto the ink-receiver. Printing can be accomplished by moving a print head across the ink-receiver or vice versa. Early patents on ink-jet printers include U.S. Pat. No. 3,739,393 (MEAD CORP), U.S. Pat. No. 3,805,273 (MEAD CORP) and U.S. Pat. No. 3,891,121 (MEAD CORP).

The jetting of the ink droplets can be performed in several different ways. In a first type of process called continuous ink-jet printing, the ink stream jetted from an orifice of the print head is broken up, by applying a pressure wave pattern to this orifice, into ink droplets of uniform size and spacing, which can be electrostatically charged or not as desired. In one embodiment the charged drops are deflected by an electric field into a gutter for recuperation, while the uncharged drops are undeflected and land on the ink-receiver to form an image. In an alternative embodiment it is the charged droplets which land on the ink-receiver to form an image and it is the uncharged droplets which are recuperated.

According to a second process the ink droplets can be created by a "drop on demand" method (DOD). A drop-on-demand device ejects ink droplets only when they are needed for imaging on the ink-receiver, thereby avoiding the complexity of drop charging, deflection hardware, and ink collection. In drop-on-demand ink-jet printing, the ink droplet can be formed by means of a pressure wave created by a mechanical motion of a piezoelectric transducer (so-called "piezo method"), or by means of discrete thermal pushes (so-called "bubble jet" method, or "thermal jet" method).

It will be readily understood that the optimal composition of an ink is dependent on the ink jetting method used and on the nature of the ink-receiver to be printed.

The ink compositions can be roughly divided into:
water based, the drying mechanism involving absorption, penetration and evaporation;
oil based, the drying involving absorption and penetration;
solvent based, the drying mechanism involving primarily evaporation;
hot melt or phase change, in which the ink is liquid at the ejection temperature but solid at room temperature and wherein drying is replaced by solidification;
UV-curable, in which drying is replaced by polymerization.

In most applications of inkjet printing the printed image is the final product at the disposal of the end-user. This is for instance the case in so-called small office/home office applications whereby information digitally stored on a personal computer is printed on a small format and on a small number of copies. This includes, for example, printing of text and images for an article, a report, a presentation, and the printing of photographs taken by a digital camera. Other end-user applications include wide format poster printing, proofing printing, and industrial applications, such as the printing of packaging elements, cables etc.

However, several applications are known wherein the jetted image is not the final product but an intermediate or mask for the image-wise exposure of a UV sensitive element. For instance, screened dot and line images prepared by ink-jet can be used for the exposure of a pre-sensitized offset plate precursor, a flexographic printing plate precursor, a silk screen printing element precursor, and a printed circuit board precursor.

For instance, EP 992846 A (AGFA) discloses a method for the production of a printing plate by exposure through a mask consisting of a screened ink-jet image formed on an ink-jet receiver comprising an N-containing polymer as binder.

EP 1349004 A (AGFA) discloses a method for the preparation of a flexographic printing plate involving the following steps, in order:

(1) preparing an ink-jet recording material comprising (i) a transparent support having front and back sides, and (ii) at the front side a layer assemblage of at least two ink receiving layers, comprising a binder, a cationic mordant in at least one of these layers, and further a spacing agent in the top layer of said assemblage, (2) jetting information-wise, according to digitally stored data, droplets of an UV-absorbing ink onto the front side of said ink-jet recording material by means of an ink-jet printer, thus forming a screened printed ink-jet image, (3) flood exposing by actinic light a flexographic printing plate precursor through a master consisting of the ink-jet image obtained by steps 1 and 2, (4) developing the exposed flexographic printing plate precursor into a flexographic printing plate.

Further patents disclosing methods and specific ink compositions for jetting onto a transparent material which are then used as a photo mask include U.S. Pat. No. 5,495,803 (GERBER), EP 737722 A (JUJo PAPER) and WO 9725206 (POLYFIBRON TECHNOLOGIES).

U.S. Pat. No. 3,531,479 (KODAK) discloses light stable compounds suitable as colorants and UV inhibitors for various plastics.

U.S. Pat. No. 5,489,503 (CIBA) discloses UV absorbers of the bis- or tris-2'-hydroxyphenyltriazine type for use in photographic materials, inks and recording materials for ink-jet printing, and in surface coatings.

GB 1096488 (BASF) discloses pyrazol-3-one compounds for mass colouring of styrene polymers.

U.S. Pat. No. 5,997,628 (ENGELHARD CORP) discloses a heat stable red shade yellow pigment composition.

In order to obtain a good differentiation between image and non-image parts in the final print, it is indispensable that the ink-jet image serving as a mask shows a high density in the ultra-violet spectral region. This requires the incorporation in the ink-jet printing ink of an efficient ultra-violet absorbing compound.

The incorporation of particular classes of UV-absorbers in ink-jet inks is well known in the prior art. References on the subject include U.S. Pat. No. 4,256,493 (DAINIPPON TORYO) disclosing p-benzophenones as UV-absorbers; JP 58049764 A disclosing 2,2'-mercaptopyridine-N-oxide sodium salt as UV-absorber; JP 59053566 A disclosing an ink containing 2-hydroxy-4-methoxybenzophenone-5-sulphonic acid; Research Disclosure 242 284-5 (1984) disclosing benzophenones, benzotriazoles, benzylidene malonates, salicylates, monobenzoates, oxamides and other compounds suitable as UV-absorbers.

However, there is a permanent need for still more efficient UV-absorbers in ink-jet inks.

OBJECTS OF THE INVENTION

It is an object of the present invention to provide an ink-jet ink composition with a high absorption in the ultraviolet spectral region.

It is a further object of the present invention to provide a method for making an information-wise mask by means of ink-jet printing for the exposure of a UV sensitive printing element.

Further objects of the invention will become apparent from the description hereinafter.

SUMMARY OF THE INVENTION

It has been surprisingly found that an ink-jet image with high absorption in the UV spectral region can be realized using a UV-absorbing compound according to formula (I):

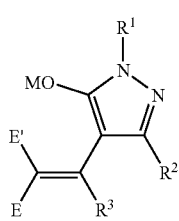

formula (I)

wherein $R^1$ is selected from the group consisting of hydrogen, a substituted or unsubstituted, saturated or unsaturated aliphatic group, which may be interrupted by at least one heteroatom and may be cyclic, and a substituted or unsubstituted aromatic or heteroaromatic group;

$R^2$ is selected from the group consisting of hydrogen, a substituted or unsubstituted, saturated or unsaturated aliphatic group, which may be interrupted by at least one heteroatom, a substituted or unsubstituted aromatic or heteroaromatic group, —$COR^4$ and —$NR^5R^6$;

$R^3$ is selected from the group consisting of hydrogen, a substituted or unsubstituted, saturated or unsaturated aliphatic group, which may be interrupted by at least one heteroatom, a substituted or unsubstituted aromatic or heteroaromatic group, and E";

E, E' and E" independently represent an electron withdrawing group;

$R^4$ is selected from the group consisting of a hydrogen, a substituted or unsubstituted, saturated or unsaturated aliphatic group, which may be interrupted by at least one heteroatom, a substituted or unsubstituted aromatic or heteroaromatic group, —$OR^7$ and —$NR^8R^9$;

M represents a hydrogen or a counter-ion $R^5$ and $R^6$ are independently selected from the group consisting of hydrogen, a substituted or unsubstituted, saturated or unsaturated aliphatic group, which may be interrupted by at least one heteroatom, a substituted or unsubstituted aromatic or heteroaromatic group, an acyl group, an oxalyl group, a sulphonyl group and a phosphoryl group;

$R^7$ to $R^9$ are independently selected from the group consisting of hydrogen, a substitututed or unsubstituted, saturated or unsaturated aliphatic group, which may be interrupted by at least one heteroatom and a substituted or unsubstituted aromatic or heteroaromatic group any of the possible combinations of $R^2$, $R^3$, E and E' may combine to form a ring;

$R^5$ and $R^6$ may represent the necessary atoms to form a 5- to 8-membered ring; and $R^8$ and $R^9$ may represent the necessary atoms to form a 5- to 8-membered ring.

Objects of the present invention have been realized by an ink-jet ink containing at least one UV-absorbing compound according to formula (I) as described above.

Objects of the present invention have also been realized by a method for preparing a printing element comprising the following steps:

(1) providing an ink-jet recording material on a transparent support, (2) information-wise jetting droplets of a UV-absorbing ink composition as defined above onto the front surface of the ink-jet recording material by means of an ink-jet printer thus forming a printed image, (3) overall exposing to UV light a UV-sensitive printing element precursor through a mask consisting of the printed image formed by steps 1 and 2, (4) developing the exposed UV-sensitive printing element precursor into a printing element.

Further advantages and embodiments of the present invention will become apparent from the following description.

DISCLOSURE OF THE INVENTION

Definitions

The term "UV" is used in the present application as an abbreviation for ultraviolet radiation.

The term "ultraviolet radiation" as used in the present invention, means electromagnetic radiation in the wavelength range of 4 to 400 nanometers.

The term "UV-absorber" as used in the present invention, means a substance that absorbs ultraviolet radiation and which dissipates the absorbed ultraviolet radiant energy without chemical change.

The term "actinic light" as used in the present invention, means electromagnetic radiation capable of initiating photochemical reactions.

The term "mask" as used in the present invention, means a material used to shield selected portions of the surface of a precursor (e.g. a printing plate precursor) during the exposure process with ultraviolet radiation.

The term "printing element" as used in the present invention, means the component carrying the image information used for printing the image information onto a surface.

Examples of a printing element are a lithographic printing plate and a flexographic printing plate.

In disclosing the present invention the terms "transparent material" and "transparent support" refer to a material respectively a support where at least 50% of the incident ultraviolet radiation is allowed to pass through the material and support respectively.

The term "colorant", as used in the present invention, means dyes and pigments.

The term "dye", as used in the present invention, means a colorant having a solubility of 10 mg/L or more in the medium in which it is applied and under the ambient conditions pertaining.

The term "pigment" is defined in DIN 55943, herein incorporated by reference, as an inorganic or organic, chromatic or achromatic colouring agent that is practically insoluble in the application medium under the pertaining ambient conditions, hence having a solubility of less than 10 mg/L therein.

The term "filler", as used in the present invention, means an inorganic or organic material present in a layer of the ink-jet recording material to modify its properties, e.g. adhesion of a subbing layer to a polyester film, opacity of an ink-jet recording material and tribo-electrical properties.

The term "alkyl" means all variants possible for each number of carbon atoms in the alkyl group i.e. for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethylpropyl and 2-methyl-butyl etc.

The term "acyl group" as used in disclosing the present invention means

—(C=O)-aryl and —(C=O)-alkyl groups.

The term "aliphatic group" as used in disclosing the present invention means saturated straight chain, branched chain and alicyclic hydrocarbon groups.

The term "unsaturated aliphatic group" as used in disclosing the present invention means straight chain, branched chain and alicyclic hydrocarbon groups which contain at least one double or triple bond.

The term "aromatic group" as used in disclosing the present invention means an assemblage of cyclic conjugated carbon atoms, which are characterized by large resonance energies, e.g. benzene, naphthalene and anthracene.

The term "alicyclic hydrocarbon group" means an assemblage of cyclic conjugated carbon atoms, which do not form an aromatic group, e.g. cyclohexane.

The term "substituted" as used in disclosing this invention means that one or more of the carbon atoms and/or that a hydrogen atom of one or more of carbon atoms in an aliphatic group, an aromatic group or an alicyclic hydrocarbon group, are replaced by an oxygen atom, a nitrogen atom, a sulphur atom, a selenium atom or a tellurium atom. Such substituents include hydroxyl groups, ether groups, carboxylic acid groups, ester groups, amide groups and amine groups.

The term "heteroaromatic group" means an aromatic group wherein at least one of the cyclic conjugated carbon atoms is replaced by an oxygen atom, a nitrogen atom, a sulphur atom, a selenium atom or a tellurium atom.

The term "heterocyclic group" means an alicyclic hydrocarbon group wherein at least one of the cyclic conjugated carbon atoms is replaced by an oxygen atom, a nitrogen atom, a sulphur atom, a selenium atom or a tellurium atom.

Ink-Jet Ink

The ink-jet ink, according to the present invention, containing a UV-absorbing compound according to formula (I) is preferably a water-based ink, an oil based ink or a solvent based ink. However, the inkjet ink of the present invention may also be a UV-curable ink incorporating at least one UV-absorbing compound according to formula (I). For wet-on-wet printing, as disclosed by WO 03074619 A (DOTRIX NV—SERICOL LTD), the curing speed of the four different color inks have to be controlled in order to obtain a good printing quality. This can be obtained by adjusting the UV-absorption with at least one UV-absorbing compound according to formula (I).

The ink-jet ink according to the present invention preferably further comprises a colorant. Any colorant may be used to impart the desired color to the ink. In embodiments of the present invention the colorant may include at least one pigment, at least one dye, or a combination thereof. The colorant may be present in the ink composition in any effective amount, generally from about 0.5 to about 20 percent by weight of the ink.

The ink-jet ink according to the present invention may contain at least one humectant to prevent the clogging of the nozzle, due to its ability to slow down the evaporation rate of ink.

The ink-jet ink of the present invention may further include at least one surfactant. The surfactant can be anionic, cationic, non-ionic, or zwitter-ionic and added in a total amount below 20 wt % based on the total ink weight.

A biocide may be added to the ink-jet ink according to the present invention to prevent unwanted microbial growth, which may occur in the ink-jet ink over time. The biocide may be used either singly or in combination.

The ink-jet ink according to the present invention may further comprise at least one thickener for viscosity regulation in the ink-jet ink.

The ink-jet ink according to the present invention may further comprise at least one antioxidant for improving the storage stability of an image.

Ink-jet inks according to the present invention may contain water and/or organic solvents, such as alcohols, fluorinated solvents and dipolar aprotic solvents. Preferable solvents are methanol, ethanol, propanol, 1-butanol, 1-pentanol, 2-butanol, t.-butanol, glycol, glycolethers, N-methylpyrrolidone, N,N-dimethylacetamid, N,N-dimethylformamid, 2,4-pentanedione and hexafluoroacetone are used.

The ink-jet ink according to the present invention preferably further comprises at least one UV-polymerizable monomer and/or oligomer.

The ink-jet ink according to the present invention preferably further comprises at least one photoinitiator.

Inks of the present invention may include additives such as buffering agents, anti-mold agents, pH adjustment agents, electric conductivity adjustment agents, chelating agents, anti-rusting agents, light stabilizers, monomers, dendrimers, polymers, and the like. Such additives may be included in the ink-jet inks of the present invention in any effective amount, as desired. Examples of pH controlling agents suitable for inks of the present invention include, but are not limited to, acids, and bases, including hydroxides of alkali metals such as lithium hydroxide, sodium hydroxide and potassium hydroxide. The amount included will depend, of course, on the specific component being included.

The ink compositions of the present invention may further comprise conducting or semiconducting polymers, such as polyanilines, polypyrroles, polythiophenes such as poly(ethylenedioxythiophene) (PEDOT), substituted or unsubstituted poly(phenylenevinylenes) (PPV's) such as PPV and MEH-PPV, polyfluorenes such as PF6, etc.

UV-Absorber

The ink-jet ink of the present invention comprises at least one UV-absorbing compound according to formula (I) as described above:

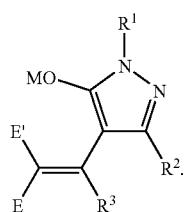

formula (I)

In a preferred embodiment $R^1$ is an aryl group.

In a further preferred embodiment, particularly when the main solvent of the ink composition is water, $R^1$ is an aryl group substituted by a water-solubilizing group, e.g. a carboxylate or sulphonate group.

In a preferred embodiment the electron-withdrawing groups E, E', and E'' are independently selected from the group consisting of keto groups, ester, amide, nitrile, sulphonate ester, sulphone, and sulphonamide groups, with nitrile being particularly preferred.

Suitable examples of UV-absorbing compounds used in accordance with the present invention are disclosed in Table 1.

TABLE 1

UVA-1

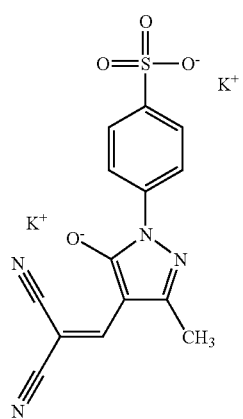

TABLE 1-continued

UVA-2

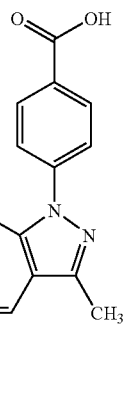

UVA-3

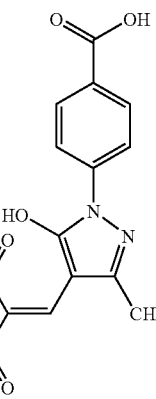

UVA-4

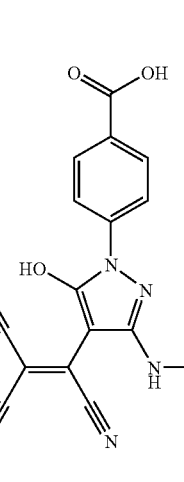

TABLE 1-continued
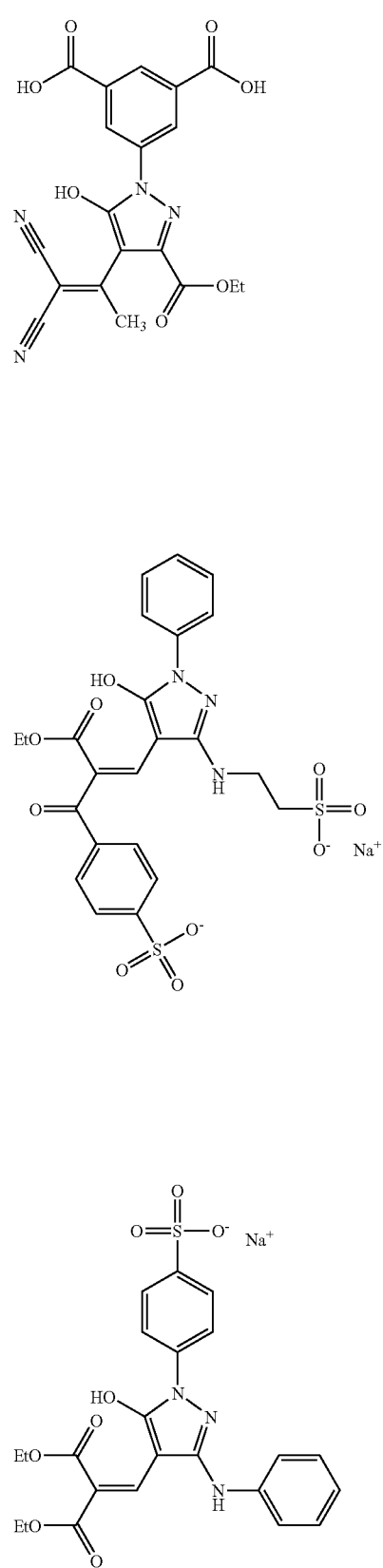
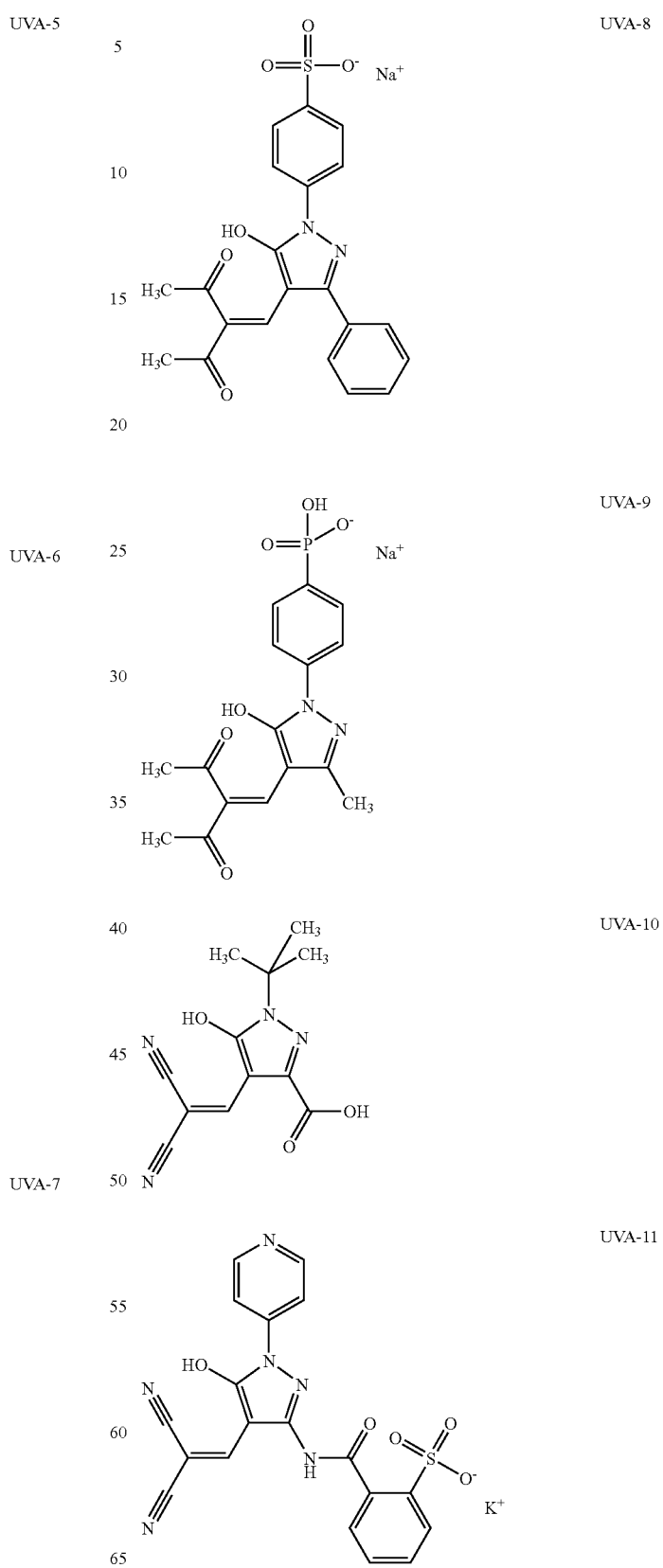

TABLE 1-continued
UVA-12
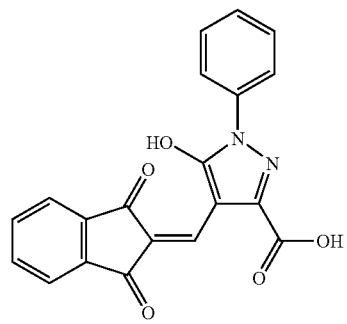
UVA-13
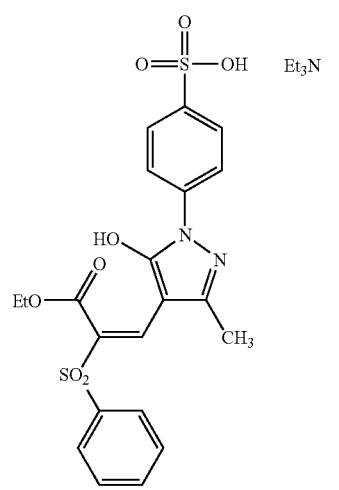
UVA-14
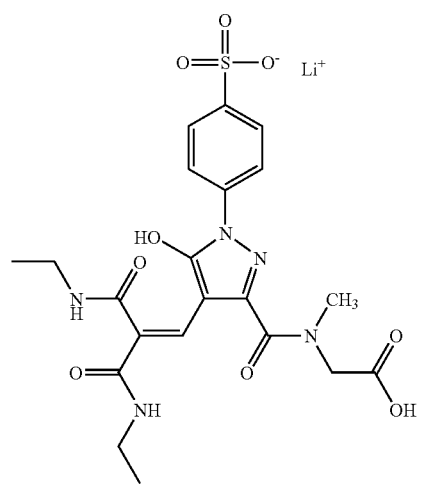
TABLE 1-continued
UVA-15
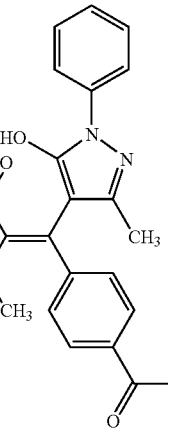
UVA-16
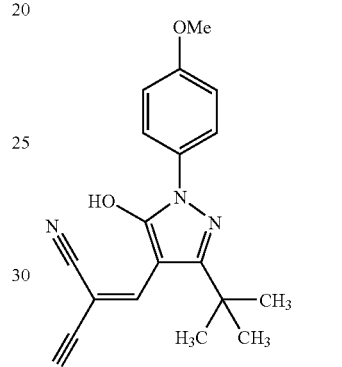
UVA-17
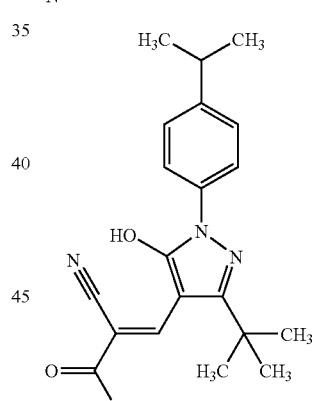
UVA-18
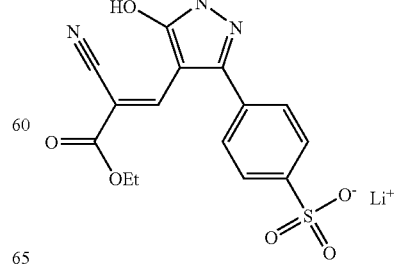

TABLE 1-continued

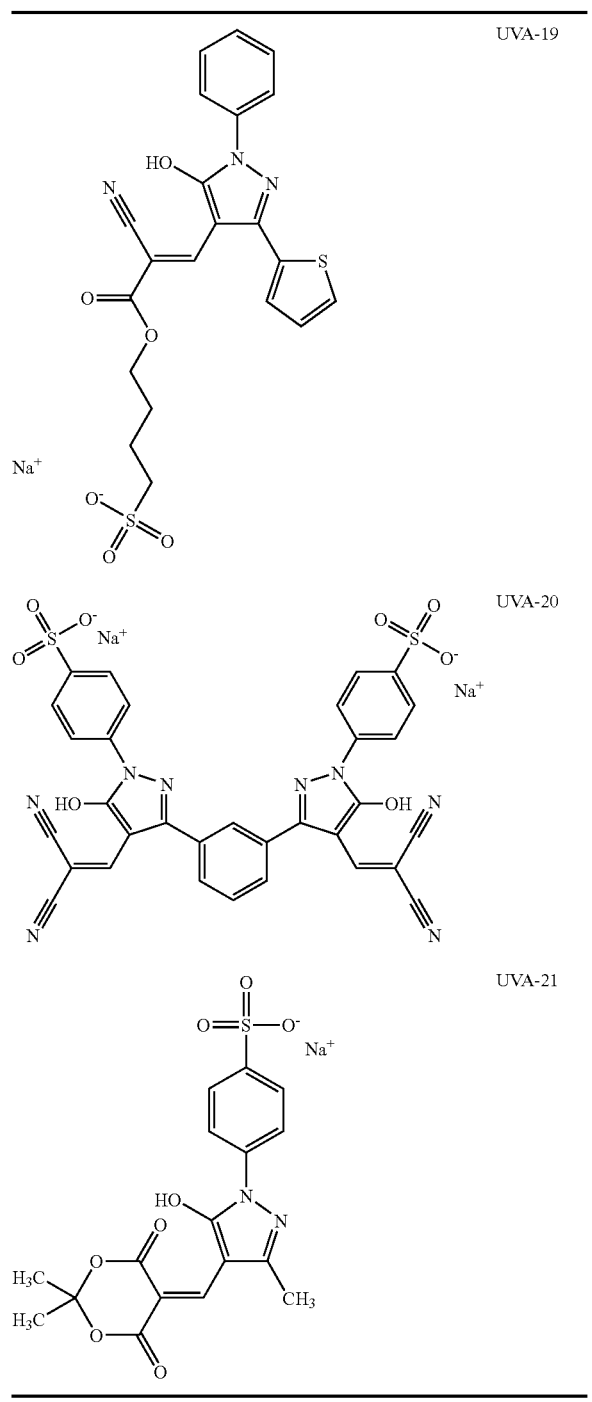

The preferred UV-absorbing compound is compound UVA-1.

Preferably the UV-absorbing compound absorbs substantially only in the UV. spectral region. However, in designing a color ink, it is possible to use an UV-absorbing compound absorbing in the visible light spectral region by adjusting the concentration of the colorant and/or selecting different colorants.

The UV-absorbing compound can be added to the ink-jet ink as a separate solution or a separate dispersion, or it can be added adsorbed on a pigment, an inorganic particle or a polymer particle. Preferably it is added as a solution.

The UV-absorbing compound is added preferably in an amount of 0.01 to 20 wt %, more preferably 0.1 to 10 wt % based on the total ink weight.

Pigments

The pigment particles should be sufficiently small to permit free flow of the ink through the ink-jet printing device, especially at the ejecting nozzles which usually have a diameter ranging from 10 μm to 50 μm. The particle size influences also the pigment dispersion stability. It is also desirable to use small particles for maximum color strength.

The average particle diameter of the pigment should be between 0.005 μm and 15 μm. Preferably, the average pigment particle size is between 0.005 and 5 μm, more preferably between 0.005 and 1 μm, and particularly preferably between 0.005 and 0.3 μm. Larger pigment particle sizes may be used as long as the objectives of the present invention are achieved.

Very fine dispersions of pigments and methods for their preparation are disclosed in e.g. EP 776952 A, U.S. Pat. No. 5,538,548, U.S. Pat. No. 5,443,628, EP 259130 A, U.S. Pat. No. 5,285,064, EP 429828 A and EP 526198 A.

The pigment can be black, cyan, magenta, yellow, red, blue, green, brown, mixtures thereof, and the like. For example, suitable pigment materials include carbon blacks such as Regal 400R, Mogul L, Elftex 320 from Cabot Co., or Carbon Black FW18, Special Black 250, Special Black 350, Special Black 550, Printex 25, Printex 35, Printex 55, Printex 150T from DEGUSSA Co., and Pigment Black 7. Additional examples of suitable pigments are disclosed in U.S. Pat. No. 5,389,133 (XEROX).

Suitable pigments for the inkjet ink according to the present invention include: C. I. Pigment Yellow 17, C. I. Pigment Blue 27, C. I. Pigment Red 49:2, C. I. Pigment Red 81:1, C. I. Pigment Red 81:3, C. I. Pigment Red 81:x, C. I. Pigment Yellow 83, C. I. Pigment Red 57:1, C. I. Pigment Red 49:1, C. I. Pigment Violet 23, C. I. Pigment Green 7, C. I. Pigment Blue 61, C. I. Pigment Red 48:1, C. I. Pigment Red 52:1, C. I. Pigment Violet 1, C. I. Pigment White 6, C. I. Pigment Blue 15, C. I. Pigment Yellow 12, C. I. Pigment Blue 56, C. I. Pigment Orange 5, C. I. Pigment Black 7, C. I. Pigment Yellow 14, C. I. Pigment Red 48:2, C. I. Pigment Blue 15:3, C. I. Pigment Yellow 1, C. I. Pigment Yellow 3, C. I. Pigment Yellow 13, C. I. Pigment Orange 16, C. I. Pigment Yellow 55, C. I. Pigment Red 41, C. I. Pigment Orange 34, C. I. Pigment Blue 62, C. I. Pigment Red 22, C. I. Pigment Red 170, C. I. Pigment Red 88, C. I. Pigment Yellow 151, C. I. Pigment Red 184, C. I. Pigment Blue 1:2, C. I. Pigment Red 3, C. I. Pigment Blue 15:1, C.I. Pigment Blue 15:3, C.I. Pigment Blue 15:4, C. I. Pigment Red. 23, C. I. Pigment Red 112, C. I. Pigment Yellow 126, C. I. Pigment Red 169, C. I. Pigment Orange 13, C. I. Pigment Red 1–10, 12, C.I. Pigment Blue 1:X, C.I. Pigment Yellow 42, C.I. Pigment Red 101, C.I. Pigment Brown 6, C. I. Pigment Brown 7, C. I. Pigment Brown 7:X, C. I. Pigment Black 11, C. I. Pigment Metal 1, C. I. Pigment Metal 2, C.I. Pigment Yellow 128, C.I. Pigment Yellow 93, C.I. Pigment Yellow 74, C.I. Pigment Yellow 138, C.I. Pigment Yellow 139, C.I. Pigment Yellow 154, C. I. Pigment Yellow 185, C.I. Pigment Yellow 180, C.I. Pigment Red 122, C.I. Pigment Red 184, bridged aluminium phtalocyanine pigments and solid solutions of pigments.

Further the pigment may be chosen from those disclosed by HERBST, W, et al. Industrial Organic Pigments, Production, Properties, Applications. 2nd edition. vch, 1997.

Most preferred pigments are Pigment Yellow 1, 3, 128, 109, 93, 17, 14, 10, 12, 13, 83, 65, 75, 74, 73, 138, 139, 154, 151, 180, 185; Pigment Red 122, 22, 23, 17, 210, 170, 188, 185, 146, 144, 176, 57:1, 184, 202, 206, 207; Pigment Blue 15:3, Pigment Blue 15:2, Pigment Blue 15:1, Pigment Blue 15:4, Pigment Blue 15:6, Pigment Blue 16; carbon black.

The pigment may be added in the form of a dispersion comprising a dispersant also called a pigment stabilizer. The latter may be, for example, of the polyester, polyurethane of polyacrylate type, especially in the form of high molecular weight block copolymer, and would typically be incorporated at 2.5% to 100% by weight of the pigment. Suitable examples are DISPERBYK® dispersants available from BYK CHEMIE or SOLSPERSE® dispersants available from ZENECA. A detailed list of non-polymeric as well as some polymeric dispersants is disclosed by MC CUTCHEON. Functional Materials, North American Edition. Glen Rock, N.J.: Manufacturing Confectioner Publishing Co., 1990. p. 110–129.

Suitable pigment stabilizers are also disclosed in DE 19636382 (BAYER), U.S. Pat. No. 5,720,802 (XEROX), U.S. Pat. No. 5,713,993 (DU PONT), PCT/GB95/02501, U.S. Pat. No. 5,085,689 (BASF) and . U.S. Pat. No. 2,303, 376 (FUJITSU ISOTEC).

Dyes

Dyes suitable for the inkjet ink according to the present invention include direct dyes, acidic dyes, basic dyes and reactive dyes.

Suitable direct dyes for the ink-jet ink according to the present invention include:

C.I. Direct Yellow 1, 4, 8, 11, 12, 24, 26, 27, 28, 33, 39, 44, 50, 58, 85, 86, 100, 110, 120, 132, 142, and 144

C.I. Direct Red 1, 2, 4, 9, 11, 134, 17, 20, 23, 24, 28, 31, 33, 37, 39, 44, 47, 48, 51, 62, 63, 75, 79, 80, 81, 83, 89, 90, 94, 95, 99, 220, 224, 227 and 343

C.I. Direct Blue 1, 2, 6, 8, 15, 22, 25, 71, 76, 78, 80, 86, 87, 90, 98, 106, 108, 120, 123, 163, 165, 192, 193, 194, 195, 196, 199, 200, 201, 202, 203, 207, 236, and 237

C.I. Direct Black 2, 3, 7, 17, 19, 22, 32, 38, 51, 56, 62, 71, 74, 75, 77, 105, 108, 112, 117, and 154

Suitable acidic dyes for the ink-jet ink according to the present invention include:

C.I. Acid Yellow 2, 3, 7, 17, 19, 23, 25, 20, 38, 42, 49, 59, 61, 72, and 99

C.I. Acid Orange 56 and 64

C.I. Acid Red 1, 8, 14, 18, 26, 32, 37, 42, 52, 57, 72, 74, 80, 87, 115, 119, 131, 133, 134, 143, 154, 186, 249, 254, and 256

C.I. Acid Violet 11, 34, and 75

C.I. Acid Blue 1, 7, 9, 29, 87, 126, 138, 171, 175, 183, 234, 236, and 249

C.I. Acid Green 9, 12, 19, 27, and 41

C.I. Acid Black 1, 2, 7, 24, 26, 48, 52, 58, 60, 94, 107, 109, 110, 119, 131, and 155

Suitable reactive dyes for the ink-jet ink according to the present invention include:

C.I. Reactive Yellow 1, 2, 3, 14, 15, 17, 37, 42, 76, 95, 168, and 175

C.I. Reactive Red 2, 6, 11, 21, 22, 23, 24, 33, 45, 111, 112, 114, 180, 218, 226, 228, and 235

C.I. Reactive Blue 7, 14, 15, 18, 19, 21, 25, 38, 49, 72, 77, 176, 203, 220, 230, and 235

C.I. Reactive Orange 5, 12, 13, 35, and 95

C.I. Reactive Brown 7, 11, 33, 37, and 46

C.I. Reactive Green 8 and 19

C.I. Reactive Violet 2, 4, 6, 8, 21, 22, and 25

C.I. Reactive Black 5, 8, 31, and 39

Suitable basic dyes for the ink-jet ink according to the present invention include:

C.I. Basic Yellow 11, 14, 21, and 32

C.I. Basic Red 1, 2, 9, 12, and 13

C.I. Basic Violet 3, 7, and 14

C.I. Basic Blue 3, 9, 24, and 25

Dyes can only manifest the ideal color in an appropriate range of pH value. Therefore, the ink-jet ink of the present invention preferably further comprises a pH buffer, such as potassium hydroxide (KOH).

Humectants

Suitable humectants include triacetin, N-methyl-2-pyrrolidone, glycerol, urea, thiourea, ethylene urea, alkyl urea, alkyl thiourea, dialkyl urea and dialkyl thiourea, diols, including ethanediols, propanediols, propanetriols, butanediols, pentanediols, and hexanediols; glycols, including propylene glycol, polypropylene glycol, ethylene glycol, polyethylene glycol, diethylene glycol, tetraethylene glycol, and mixtures and derivatives thereof. A preferred humectant is polyethylene glycol and added to the ink-jet ink formulation in an amount of 0.1 to 20 wt %/o of the formulation, more preferably 0.1 to 10 wt %/o of the formulation, and most preferably approximately 4.0 to 6.0 wt %/o.

Surfactants

Suitable surfactants include fatty acid salts, ester salts of a higher alcohol, alkylbenzene sulphonate salts, sulphosuccinate ester salts and phosphate ester salts of a higher alcohol (for example, sodium dodecylbenzenesulphonate and sodium dioctylsulphosuccinate), ethylene oxide adducts of a higher alcohol, ethylene oxide adducts of an alkylphenol, ethylene oxide adducts of a polyhydric alcohol fatty acid ester, and acetylene glycol and ethylene oxide adducts thereof (for example, polyoxyethylene nonylphenyl ether, and SURFYNOL® 104, 440, 465 and TG available from AIR PRODUCTS & CHEMICALS INC.

Biocides

Suitable biocides for the ink-jet ink of the present invention include sodium dehydroacetate, 2-phenoxyethanol, sodium benzoate, sodium pyridinethion-1-oxide, ethyl p-hydroxybenzoate and 1,2-benzisothiazolin-3-one and salts thereof. A preferred biocide for the ink-jet ink of the present invention is Proxel® GXL available from ZENECA COLOURS.

A biocide is preferably added in an amount of 0.001 to 3 wt. %, more preferably 0.01 to 1.00 wt. %, each based on the ink-jet ink.

Thickeners

Suitable thickeners for use in the ink-jet ink according to the present invention include urea or urea derivatives, hydroxyethylcellulose, carboxymethylcellulose, hydroxypropylcellulose, derived chitin, derived starch, carrageenan, and pullulan; DNA, proteins, poly(styrenesulphonic acid), poly(styrene-co-maleic anhydride), poly(alkyl vinyl ether-co-maleic anhydride), polyacrylamid, partially hydrolyzed polyacrylamid, poly(acrylic acid), poly(vinyl alcohol), partially hydrolyzed poly(vinyl acetate), poly(hydroxyethyl acrylate), poly(methyl vinyl ether), polyvinylpyrrolidone, poly(2-vinylpyridine), poly(4-vinylpyridine) and poly(diallyldimethylammonium chloride).

The thickener is added preferably in an amount of 0.01 to 20 wt %, more preferably 0.1 to 10 wt %/o based on the ink-jet ink. The viscosity of the ink-jet ink of the invention is preferably adjusted to 30 mPa.s or less, more preferably 20 mPa.s or less.

Antioxidants

As the antioxidant for improving storage stability of an image, various organic and metal complex type fading preventives can be used in the invention. Organic fading preventives include hydroquinones, alkoxyphenols, dialkoxyphenols, phenols, anilines, amines, indanes, coumarones, alkoxyanilines and heterocycles, while metal complexes include nickel complexes and zinc complexes. More specifically, compounds as described in "Research Disclosure, No. 17643, VII, Section I or J, No. 15162, No. 18716, left column on page 650, No. 36544, page 527, No. 307105, page 872, and the patent cited in No. 15162, and compounds embraced in the formula of the typical compounds and compound examples described on pages 127 to 137 of JP 62215272 A (FUJI).

The stabilizer is added in an amount of 0.1 to 30 wt %, preferably 1 to 10 wt % based on the ink.

Monomers and Oligomers

Monomers and/or oligomers are polymerized by the curing means of the ink-jet printer. Monomers, oligomers or prepolymers may possess different degrees of functionality, and a mixture including combinations of mono-, di-, tri-and higher functionality monomers, oligomers or prepolymers may be used. These components are curable, typically photo-curable, e.g. UV curable, and should adhere to the ink-receiver surface after printing and serve to bind the colorant.

Adjusting the ratio between the monomers and oligomers is also a method of adjusting the viscosity of the ink. A higher functionality results in a higher viscosity.

Any method of conventional radical polymerization, photo-curing system using photo acid or photo base generator, or photo induction alternating copolymerization may be employed. In general, radical polymerization and cationic polymerization are preferred, and photo induction alternating copolymerization needing no initiator may also be employed. Further, a hybrid system of combinations of these systems is also effective.

Radical polymerization is the most widely employed process. Cationic polymerization is however superior in effectiveness due to lack of inhibition of polymerization by oxygen, however it is slow and its cost is high. If cationic polymerization is used, it is preferred to use an epoxy compound.

Any polymerizable compound commonly known in the art may be employed. Particularly preferred for the ink-jet ink according to the present invention are monofunctional and/or polyfunctional acrylate monomers, oligomers or prepolymers, such as isoamyl acrylate, stearyl acrylate, lauryl acrylate, octyl acrylate, decyl acrylate, isoamylstyl acrylate, isostearyl acrylate, 2-ethylhexyl-diglycol acrylate, 2-hydroxybutyl acrylate, 2-acryloyloxyethylhexahydrophthalic acid, butoxyethyl acrylate, ethoxydiethylene glycol acrylate, methoxydiethylene glycol acrylate, methoxypolyethylene glycol acrylate, methoxypropylene glycol acrylate, phenoxyethyl acrylate, tetrahydrofurfuryl acrylate, isobornyl acrylate, 2-hydroxyethyl acrylate, 2-hydroxypropyl acrylate, 2-hydroxy-3-phenoxypropyl acrylate, vinyl ether acrylate, 2-acryloyloxyethylsuccinic acid, 2-acryloyxyethylphthalic acid, 2-acryloxyethyl-2-hydroxyethyl-phthalic acid, lactone modified flexible acrylate, and t-butylcyclohexyl acrylate, triethylene glycol diacrylate, tetraethylene glycol diacrylate, polyethylene glycol diacrylate, dipropylene glycol diacrylate, tripropylene glycol diacrylate, polypropylene glycol diacrylate, 1,4butanediol diacrylate, 1,6hexanediol diacrylate, 1,9nonanediol diacrylate, neopentyl glycol diacrylate, dimethylol-tricyclodecane diacrylate, bisphenol A EO (ethylene oxide) adduct diacrylate, bisphenol A PO (propylene oxide) adduct diacrylate, hydroxypivalate neopentyl glycol diacrylate, alkoxylated dimethyloltricyclodecane diacrylate and polytetramethylene glycol diacrylate, trimethylolpropane triacrylate, EO modified trimethylolpropane triacrylate, tri (propylene glycol) triacrylate, caprolactone modified trimethylolpropane triacrylate, pentaerythritol triacrylate, pentaerithritol tetraacrylate, pentaerythritolethoxy tetraacrylate, dipentaerythritol hexaacrylate, ditrimethylolpropane tetraacrylate, glycerinpropoxy triacrylate, and caprolactam modified dipentaerythritol hexaacrylate, or an N-vinylamide such as, N-vinylcaprolactam or N-vinylformamide; or acrylamide or a substituted acrylamide, such as acryloylmorpholine.

Furthermore, methacrylates corresponding to the above-mentioned acrylates may be used with these acrylates. Of the methacrylates, methoxypolyethylene glycol methacrylate, methoxytriethylene glycol methacrylate, hydroxyethyl methacrylate, phenoxyethyl methacrylate, cyclohexyl methacrylate, tetraethylene glycol dimethacrylate, and polyethylene glycol dimethacrylate are preferred due to their relatively high sensitivity and improved adhesion to an ink-receiver surface.

Furthermore, the ink-jet inks may also contain polymerizable oligomers. Examples of these polymerizable oligomers include epoxy acrylates, aliphatic urethane acrylates, aromatic urethane acrylates, polyester acrylates, and straight-chained acrylic oligomers.

Photoinitiators

A catalyst called a photo-initiator typically initiates the polymerization reaction. The photoinitiator requires less energy to activate than the monomers and oligomers to form the polymer.

The photoinitiator absorbs light and is responsible for the production of free radicals or cations. Free radicals or cations are high-energy species that induce polymerization of monomers, oligomers and polymers and with polyfunctional monomers and oligomers thereby also inducing crosslinking.

A preferred amount of initiator is 1–10 weight % of the total ink weight, and more preferably 1–6 weight % of the total ink weight.

Irradiation with actinic radiation may be realized in two steps by changing wavelength or intensity. In such cases it is preferred to use 2 types of initiator together.

Photoinitiators are necessary for free radical curing and may include, but are not limited to, the following compounds or combinations thereof: benzophenone and substituted benzophenones, 1-hydroxycyclohexyl phenyl ketone, thioxanthones such as isopropylthioxanthone,2-hydroxy-2-methyl-1-phenylpropan-1-one, 2-benzyl-2-dimethylamino-(4-morpholinophenyl) butan-1-one, benzil dimethylketal, bis (2,6-dimethylbenzoyl)-2,4,4-trimethylpentylphosphine oxide, 2,4,6trimethylbenzoyldiphenylphosphine oxide, 2-methyl-1-[4-(methylthio)phenyl]-2-morpholinopropan-1-one, 2,2-dimethoxy-1,2-diphenylethan-1-one or 5,7-diiodo-3-butoxy-6-fluorone, diphenyliodonium fluoride and triphenylsulfonium hexafluophosphate.

Suitable photo-initiators for use in the ink-jet ink according to the present invention include Irgacure® 184, Irgacure® 500, Irgacure® 907, Irgacure® 369, Irgacure® 1700, Irgacure® 651, Irgacure® 819, Irgacure® 1000, Irgacure® 1300, Irgacure® 1870, Darocure® 1173 and Darocure® 4265 available from CIBA SPECIALTY CHEMICALS, Lucerin TPO available from BASF AG, Esacure® KT046, Esacure® KIP150, Esacure® KT37 and Esacure® EDB available from LAMBERTI, H-Nu® 470 and H-Nu® 470X available from SPECTRA GROUP Ltd. and isopropylthioxanthone.

Ink-Receiving Material

The ink-jet receiving material to be used with the ink-jet ink according to the present invention comprises a transparent support. Transparent polyester film supports and especially polyethylene terephthalate (PET) are preferred because of their excellent properties of dimensional stability. The dimensional stability is important when a number of printing plates are required to produce colored images.

UV-curable ink-jet inks are suitable for use on substantially non-absorbing ink-jet receiving materials, e.g. a subbed or unsubbed polyethylene terephthalate support.

When water based or solvent based ink-jet inks are used the ink-jet receiving material preferably comprises a support and one or more ink-receiving layers. Preferably, the ink-receiving layer is porous and contains a binder and a filler.

The binder can be chosen from a list of compounds well-known in the art including hydroxyethyl cellulose; hydroxypropyl cellulose; hydroxyethylmethyl cellulose; hydroxypropyl methyl cellulose; hydroxybutylmethyl cellulose; methyl cellulose; sodium carboxymethyl cellulose; sodium carboxymethylhydroxethyl cellulose; water soluble ethylhydroxyethyl cellulose; cellulose sulphate; polyvinyl alcohol; vinylalcohol copolymers; polyvinyl acetate; polyvinyl acetal; polyvinyl pyrrolidone; polyacrylamide; acrylamid/acrylic acid copolymer; polystyrene, styrene copolymers; acrylic or methacrylic polymers; styrene/acrylic copolymers; ethylene-vinylacetate copolymer; vinylmethyl ether/maleic acid copolymer; poly(2-acrylamido-2-methyl propane sulphonic acid); poly(diethylene triamine-co-adipic acid); polyvinyl pyridine; polyvinyl imidazole; polyethylene imine epichlorohydrin modified; polyethylene imine ethoxylated; polyethylene oxide; polyurethane; melamine resins; gelatin; carrageenan; dextran; gum arabic; casein; pectin; albumin; starch; collagen derivatives; collodion and agar—agar.

A preferred binder for the practice of the present invention is a polyvinylalcohol (PVA), a vinylalcohol copolymer or modified polyvinyl alcohol.

The filler may be chosen from the inorganic fillers well-known in the art such as silica, talc, clay, hydrotalcite, kaolin, diatomaceous earth, calcium carbonate, magnesium carbonate, basic magnesium carbonate, aluminosilicate, aluminum trihydroxide, aluminium oxide (alumina), titanium oxide, zinc oxide, barium sulphate, calcium sulphate, zinc sulphide, satin white, boehmite (alumina hydrate), zirconium oxide or mixed oxides.

In a preferred embodiment the filler is chosen from silica, aluminosilicate, alumina, calcium carbonate, alumina hydrate, and aluminium trihydroxide.

Mixtures of different fillers may also be used.

In an alternative embodiment the filler can be chosen from organic particles such as polystyrene, polymethyl methacrylate, silicones, melamine-formaldehyde condensation polymers, urea-formaldehyde condensation polymers, polyesters and polyamides. Mixtures of inorganic and organic fillers can be used. However, most preferably the filler is an inorganic filler.

The ink-receiving layer may further contain well-known conventional ingredients, such as a cationic substance acting as mordant, surfactants serving as coating aids, hardening agents, plasticizers, stabilizers, whitening agents and matting agents.

The different layers can be coated onto the support by any conventional coating technique, such as dip coating, knife coating, extrusion coating, spin coating, slide hopper coating and curtain coating.

Printing Element

The ink-jet ink of the present invention is jetted information-wise onto an ink-jet receiving material forming a printed image. An UV-sensitive printing element precursor is then exposed with actinic light through this printed image, i.e. an UV mask, formed on the inkjet receiving material. A printing element is formed through developing the exposed UV-sensitive printing element precursor.

The printing element may be a lithographic printing plate, a flexographic printing plate, and a silk screen printing element. The printed ink-jet receiving material may also serve as mask for the exposure of a photo-resist in the manufacturing of PCB's.

EXAMPLES

The present invention will now be described in detail by way of Examples hereinafter. However the invention is not limited to these examples.

Materials

All materials used in the examples were readily available from standard commercial sources such as ALDRICH CHEMICAL Co. (Belgium) unless otherwise specified. The following materials were used:

The black dye DUASYN® BLACK KRL-SF LIQUID is available from CLARIANT. The formula of DUASIN® BLACK KRL-SF LIQUID is:

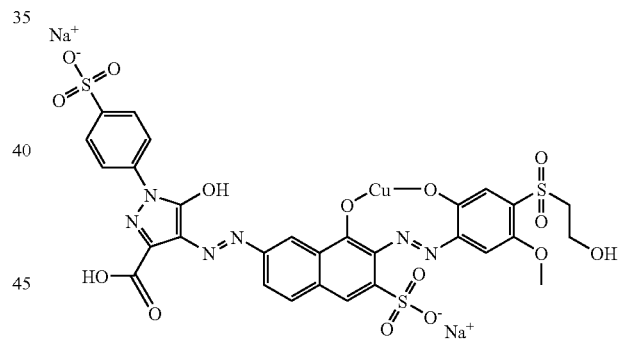

The yellow dye Y1 can be produced by synthesis as disclosed in preparation 2 of U.S. Pat. No. 3,615,546 (AGFA). The formula of yellow dye Y1 is:

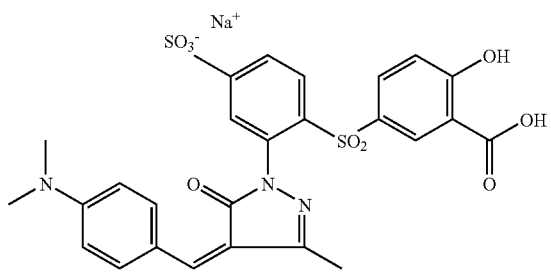

SELECTJET SCREEN FILM is an ink-receiver film marketed by AGFA-GEVAERT

SURFYNOL® 465 is a non-ionic surfactant available from AIR PRODUCTS & CHEMICALS INC.

CAB-O-JET® 200 is a 20% aqueous dispersion of a black pigment available from CABOT CORP.

Example 1

This example deals with inks containing soluble dyes. The following ink compositions were prepared

| Invention ink INV-1: | |
|---|---|
| Propyleneglycol | 14.0 g |
| Glycerol | 14.0 g |
| Surfactant SURFYNOL 465 | 0.4 g |
| DUASYN BLACK KRL-SF LIQUID | 26.66 g |
| Benzothiazole-2-one | 0.4 g |
| Triethanolamine | 0.5 g |
| UV-absorber UVA-1 | 5.0 g |
| Water up to | 100.0 g |

Comparison Ink COMP-1:

The comparison ink COMP-1 was prepared is the same manner as invention ink INV-1 but without adding the UV-absorbing compound UVA-1.

| Invention ink INV-2: | |
|---|---|
| Propyleneglycol | 14.0 g |
| Glycerol | 14.0 g |
| Surfactant SURFYNOL 465 | 0.4 g |
| Yellow dye Y1 | 4.0 g |
| Benzothiazole-2-one | 0.4 g |
| Triethanolamine | 0.5 g |
| UV-absorber UVA-1 | 5.0 g |
| Water up to | 100.0 g |

Comparison Ink COMP-2:

The comparison ink COMP-2 was prepared is the same manner as invention ink INV-2 but without adding the UV-absorbing compound UVA-1.

The four different inks INV-1, INV-2, COMP-1 and COMP-2 were jetted onto the commercially available transparent ink-jet recording material AGFA SELECTJET SCREEN FILM according to a test pattern by means of the ink-jet printer EPSON STYLUS COLOR 3000 with different printer settings.

| Printer settings | Legend |
|---|---|
| Setting A | plain paper/speed |
| Setting B | plain paper/quality |
| Setting C | 360 dpi |
| Setting D | P.Q.G.F./speed |
| Setting E | P.Q.G.F./quality |
| Setting F | backlight film |

The obtained full area UV densities, measured using a MacBeth TR1224 densitometer, are summarized in Table 2.

TABLE 2

| Printer settings | UV density | | | |
|---|---|---|---|---|
| | Ink INV-1 | Ink COMP-1 | Ink INV-2 | Ink COMP-2 |
| Setting A | 2.47 | 0.53 | 1.83 | 0.47 |
| Setting B | 4.15 | 0.72 | 3.26 | 0.55 |
| Setting C | 2.06 | 0.54 | 1.25 | 0.34 |
| Setting D | 3.81 | 0.65 | 2.62 | 0.52 |
| Setting E | 4.55 | 0.95 | 4.13 | 0.61 |
| Setting F | 4.76 | 1.24 | 4.50 | 0.63 |

It is clear from Table 2 that the presence of UV-absorber UVA-1 provides inks suitable for manufacturing masks with high UV densities for the exposure of an UV-sensitive printing element precursor.

Example 2

This example deals with ink containing a black dispersed pigment. The following ink compositions were prepared

| Invention ink INV-3: | |
|---|---|
| Propyleneglycol | 14.0 g |
| Glycerol | 14.0 g |
| Surfactant SURFYNOL 465 | 0.4 g |
| Black pigment CAB-O-JET 200 (20%) | 4.0 g |
| Benzothiazole-2-one | 0.4 g |
| Triethanolamine | 0.5 g |
| UV-absorber UVA-1 | 1.0 g |
| Water up to | 100.0 g |

Comparison Ink COMP-3:

The comparison ink COMP-3 was prepared is the same manner as invention ink INV-3 but without adding the UV-absorbing compound UVA-1.

The inks COMP-3 and INV-3 were jetted onto the commercially available transparent ink-jet recording material AGFA SELECTJET SCREEN FILM according to a test pattern with printer setting A.

The obtained full area UV densities, measured using a MacBeth TR1224 densitometer, are summarized in Table 3.

TABLE 3

| Ink | UV-density |
|---|---|
| INV-3 | 4.45 |
| COMP-3 | 3.18 |

It is clear from Table 3 that the presence of UV-absorber UVA-1 provides an ink suitable for manufacturing masks with high UV density for the exposure of an UV-sensitive printing element precursor.

Having described in detail preferred embodiments of the current invention, it will now be apparent to those skilled in the art that numerous modifications can be made therein without departing from the scope of the invention as defined in the appending claims.

The invention claimed is:

1. An ink composition for ink-jet printing comprising a UV-absorbing compound according to formula (I):

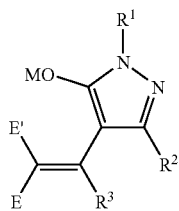

formula (I)

wherein:
- $R^1$ is selected from the group consisting of hydrogen, a substituted or unsubstituted, saturated or unsaturated aliphatic group, which may be interrupted by at least one heteroatom and may be cyclic, and a substituted or unsubstituted aromatic or heteroaromatic group;
- $R^2$ is selected from the group consisting of hydrogen, a substituted or unsubstituted, saturated or unsaturated aliphatic group, which may be interrupted by at least one heteroatom, a substituted or unsubstituted aromatic or heteroaromatic group, —$COR^4$ and —$NR^5R^6$;
- $R^3$ is selected from the group consisting of hydrogen, a substituted or unsubstituted, saturated or unsaturated aliphatic group, which may be interrupted by at least one heteroatom, a substituted or unsubstituted aromatic or heteroaromatic group, and E";
- E, E' and E" independently represent an electron withdrawing group;
- $R^4$ is selected from the group consisting of a hydrogen, a substituted or unsubstituted, saturated or unsaturated aliphatic group, which may be interrupted by at least one heteroatom, a substituted or unsubstituted aromatic or heteroaromatic group, —$OR^7$ and —$NR^8R^9$
- M represents a hydrogen or a counter-ion
- $R^5$ and $R^6$ are independently selected from the group consisting of hydrogen, a substituted or unsubstituted, saturated or unsaturated aliphatic group, which may be interrupted by at least one heteroatom, a substituted or unsubstituted aromatic or heteroaromatic group, an acyl group, an oxalyl group, a sulphonyl group and a phosphoryl group;
- $R^7$ to $R^9$ are independently selected from the group consisting of hydrogen, a substitututed or unsubstituted, saturated or unsaturated aliphatic group, which may be interrupted by at least one heteroatom and a substituted or unsubstituted aromatic or heteroaromatic group;
- any of the possible combinations of $R^2$, $R^3$, E and E' may combine to form a ring;
- $R^5$ and $R^6$ may represent the necessary atoms to form a 5- to 8-membered ring; and
- $R^8$ and $R^9$ may represent the necessary atoms to form a 5- to 8-membered ring.

2. An ink composition according to claim 1 wherein said $R^1$ group is an aromatic group substituted with a water-solubilizing group.

3. An ink composition according to claim 1 wherein said electron-withdrawing group is a nitrile group.

4. An ink composition according to claim 2 wherein said electron-withdrawing group is a nitrile group.

5. An ink composition according to claim 1 wherein said UV-absorbing compound has the formula:

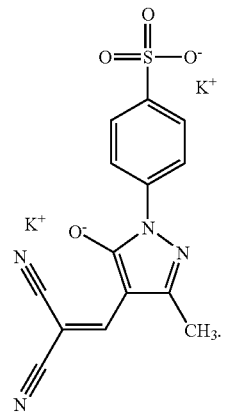

6. A method for preparing a printing element comprising the following steps
   (1) providing an ink-jet recording material on a transparent support,
   (2) information-wise jetting droplets of a UV-absorbing ink composition as claimed in claim 1 onto the front surface of the ink-jet recording material by means of an ink-jet printer thus forming a printed image,
   (3) overall exposing to UV light a UV-sensitive printing element precursor through a mask consisting of the printed image formed by steps 1 and 2,
   (4) developing the exposed UV-sensitive printing element precursor into a printing element.

7. A method according to claim 6 wherein said printing element is a lithographic printing plate.

8. A method according to claim 6 wherein said printing element is a flexographic printing plate.

9. A method according to claim 6 wherein said printing element is a silk screen printing element.

10. A method according to claim 6 wherein said printing element precursor is a printed circuit board precursor.

11. A mask in which the UV-absorbing areas contain a compound according to formula (I) as defined in claim 1.

* * * * *